(12) United States Patent
Naghib Lahouti et al.

(10) Patent No.: US 11,375,647 B2
(45) Date of Patent: Jun. 28, 2022

(54) COOLING FAN AND ELECTRONIC DEVICES WITH A COOLING FAN

(71) Applicant: Apple Inc., Cupertino, CA (US)

(72) Inventors: Arash Naghib Lahouti, San Jose, CA (US); Jesse T. Dybenko, Santa Cruz, CA (US); Anthony Joseph Aiello, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 18 days.

(21) Appl. No.: 16/791,834

(22) Filed: Feb. 14, 2020

(65) Prior Publication Data

US 2021/0051823 A1 Feb. 18, 2021

Related U.S. Application Data

(60) Provisional application No. 62/888,295, filed on Aug. 16, 2019.

(51) Int. Cl.
| | |
|---|---|
| *H05K 7/20* | (2006.01) |
| *F04D 29/42* | (2006.01) |
| *H05K 5/02* | (2006.01) |
| *H05K 5/00* | (2006.01) |

(52) U.S. Cl.
CPC ..... *H05K 7/20972* (2013.01); *F04D 29/4226* (2013.01); *H05K 5/0017* (2013.01); *H05K 5/0213* (2013.01); *H05K 5/0234* (2013.01); *H05K 7/20145* (2013.01); *H05K 7/20172* (2013.01)

(58) Field of Classification Search
CPC ........... H05K 7/20972; H05K 7/20145; H05K 7/20172; H05K 5/0017; H05K 5/0213; H05K 5/0234; H05K 7/20154; H05K 7/20136; H05K 7/20772; H05K 7/20554; F04D 29/4226; F04D 25/08; F04D 29/30
USPC ................................ 361/695; 415/90, 208.1
See application file for complete search history.

(56) References Cited

U.S. PATENT DOCUMENTS

| | | | |
|---|---|---|---|
| 6,948,912 | B2 | 9/2005 | Chang et al. |
| 7,031,157 | B2 | 4/2006 | Horng et al. |
| 7,443,670 | B2 | 10/2008 | Nishi et al. |
| 9,332,679 | B2 | 5/2016 | Carl, Jr. et al. |
| 2006/0078423 | A1* | 4/2006 | Zheng ..................... F04D 17/04 415/206 |
| 2008/0019827 | A1* | 1/2008 | Hirata ..................... G06F 1/203 415/206 |

(Continued)

*Primary Examiner* — Mandeep S Buttar
(74) *Attorney, Agent, or Firm* — Dickinson Wright RLLP

(57) ABSTRACT

An electronic device includes a fan assembly that draws air (including heated air) away from components and forces the air out of the electronic device. The fan assembly includes a guide vane located in the fan housing. Subsequent to air entering the fan assembly via the fan inlets, the guide vane is designed to direct the air to a fan outlet. Further, the guide vane is designed and positioned in the fan assembly to limit or prevent flow separation that may cause the heated air to recirculate and may also cause increased turbulence leading to elevated acoustic noise. Furthermore, the guide vane may include a tapered region to allow the heated air to readily flow over the guide vane to limit or prevent a vortex from occurring within the fan assembly. Using the guide vane, the fan assembly drives more air at the same fan speed and lowers noise generation.

19 Claims, 9 Drawing Sheets

(56) References Cited

U.S. PATENT DOCUMENTS

| | | | |
|---|---|---|---|
| 2008/0253083 A1* | 10/2008 | Okutsu | H01L 23/427 361/679.48 |
| 2012/0207618 A1* | 8/2012 | Horng | F04D 29/4226 417/44.1 |
| 2013/0120938 A1* | 5/2013 | Lang | H04N 5/64 361/707 |
| 2019/0195236 A1* | 6/2019 | Tsukamoto | F04D 29/4226 |

* cited by examiner

COOLING FAN AND ELECTRONIC DEVICES WITH A COOLING FAN

CROSS-REFERENCE TO RELATED APPLICATION(S)

This application claims the benefit of priority to U.S. Provisional Application No. 62/888,295, filed on Aug. 16, 2019, titled "COOLING FAN AND ELECTRONIC DEVICES WITH A COOLING FAN," the disclosure of which is incorporated herein by reference in their entirety.

FIELD

The following description relates to a fan assembly located in an electronic device. In particular, the following description relates to a fan assembly that includes modifications, such as a guide vane, used to improve airflow through the fan assembly. The guide vane can also reduce noise by the fan assembly during operation.

BACKGROUND

Electronic devices can include fans used to draw heated air away from internal components. As the internal components become more sophisticated, the associated processing power increases and leads to increased heat generation. In order to draw the resultant increased heated air away from the internal components, the fan can run at higher speeds. However, running the fan at a higher rotational speed tends to increase noise generation due to an associated increase in airflow velocity through the fan. Further, in some instances, not only can the increased speed generate additional nose, but also cause flow separation and recirculation in which the heated air does not flow directly out of the fan outlet. When this occurs, the overall fan performance decreases.

SUMMARY

In one aspect, an electronic device is described. The electronic device may include an enclosure that defines an internal volume. The electronic device may further include a fan assembly positioned in the internal volume. The fan assembly may include a fan housing that defines a fan inlet and a fan outlet. The fan assembly may further include an impeller that drives air into the fan inlet. The fan assembly may further include a guide vane positioned in the fan housing. In some embodiments, at least some of the air received by the impeller is directed by the guide vane prior to passing through the fan outlet.

In another aspect, an electronic device is described. The electronic device may include an enclosure that defines an internal volume. The enclosure may include an opening. The electronic device may further include a fan assembly positioned in the internal volume. The fan assembly may include a first housing part that defines a fan inlet. The fan assembly may further include a second housing part coupled with the first housing part. The second housing part may define a second fan inlet. The first housing part and the second housing part may combine to define a fan outlet that is separate from the fan inlet. The fan assembly may further include an impeller positioned between the first housing part and the second housing part. The impeller may be aligned with the fan inlet. The fan assembly may further include a guide vane that extends from the second housing part and lacks contact with the first housing part.

In another aspect, an electronic device is described. The electronic device may include an enclosure that defines an internal volume. The enclosure may include an opening. The electronic device may further include a display coupled with the enclosure. The electronic device may further include a stand rotationally coupled to the enclosure. The electronic device may further include a heat-generating component positioned in the internal volume. The electronic device may further include a fan assembly positioned in the internal volume. The fan assembly may be configured to draw air that is heated by the heat-generating component out of the enclosure via the opening. Also, the fan assembly may include a guide vane that directs the air received by the fan assembly prior exiting the opening.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
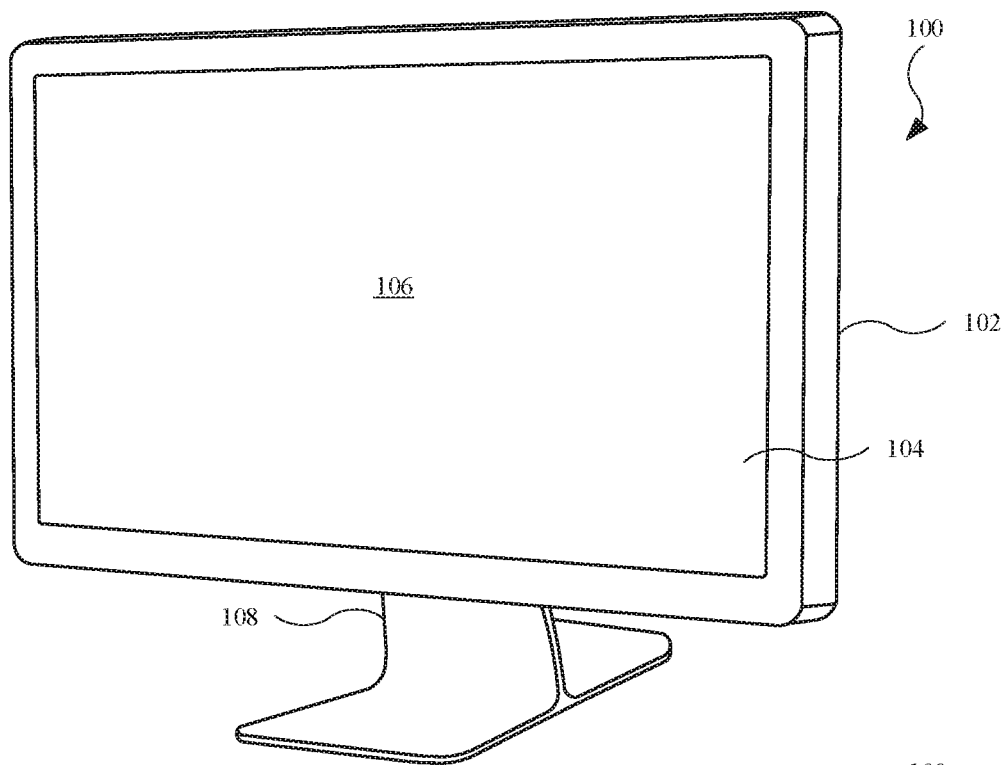
FIG. 1 illustrates a front isometric view of an embodiment of an electronic device.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a fan assembly suitable for use an electronic device. In some exemplary embodiments, fan assemblies may include a fan housing and a guide vane located in the fan housing. During operation, a fan assembly (representative of fan assemblies described herein) is designed to draw air in through multiple fan inlets, including the air heated by heat-generating components in the electronic device, and drive the heated air out of a fan outlet. The guide vane can direct airflow through the fan assembly, allowing the airflow to pass through, for example, a heat exchanger and continue through an opening (or openings) in the electronic device enclosure.

The fan assembly further includes a fan motor located on a platform attached to multiple struts, and an impeller rotationally driven by the fan motor. While the fan motor and the impeller are used to draw the air into the fan assembly, these structures (as well as the struts) may restrict the airflow into the fan assembly at the fan inlet that is closer the fan motor, resulting in less air intake as compared to that of the other fan inlet. Additionally, the fan outlet of the fan assemblies described herein may be modified to match the dimensions of other features of the electronic device, such as the heat exchanger and/or the openings in the electronic device enclosure. The airflow differential between the fan inlets and the dimensions of the fan outlet may contribute to airflow separation within the fan assembly, causing the air to flow away from the fan outlet (rather than directly out of the fan outlet). However, the guide vane is designed and positioned in the fan assembly to mitigate recirculation issues by directing the airflow through the fan outlet in such a way that eliminates or minimizes flow separation. As a result of the guide vane integration, the airflow through the housing part that includes the guide vane may increase such that the airflow is the same as, or substantially similar to, the airflow through the other housing part. Accordingly, the guide vane can increase the overall air velocity through the fan outlet as well as mitigate flow separation within the fan assembly.

Additionally, the guide vane can increase the volume of air passing through the fan assembly for a given rotational fan speed (in revolutions per minute, or RPM), as compared to a fan assembly without a guide vane. For instance, the amount of air passing through the fan assembly using the guide vane can increase by 2% or more for a given fan speed. Put another way, a fan assembly can run at a lower fan speed and drive the same, or at least substantially similar, amount of air through the fan assembly, as compared to a fan assembly without a guide vane. This leads to additional advantages. For example, broadband acoustic noise generated by a fan assembly is a function of fan speed. By reducing the fan speed, the acoustic noise perceived by a user of the electronic device is reduced, which can enhance the overall user experience of the electronic device. Both computational and empirical studies show that the guide vane not only promotes airflow through the fan assembly, but also reduces noise generation.

In some exemplary embodiments, the fan housing of the fan assembly includes two housing parts secured together, and the guide vane extends from one of the two housing parts. The guide vane can be integrated with the housing part that includes structural features used to carry the fan motor. Further, the guide vane can be designed to include a linear, or straight edge, region that extends, or approximately extends, to the same dimension as the housing part with which the guide vane is integrated. The guide vane can transition to a tapered region in a location associated with the other housing part. The tapered geometry of the guide vane can limit or prevent the interaction of the low and high air pressure regions on opposing surfaces of the guide vane in off-design conditions, which may otherwise lead to the formation of a tip vortex, which may in turn disturb the airflow downstream of the guide vane and act as a source of acoustic noise. As a result of the guide vane design, the air in the fan assembly can flow laterally around the guide vane along the linear region (where the airflow separation tends to occur without the guide vane), and over the guide vane along the tapered region.

These and other embodiments are discussed below with reference to FIGS. 1-15. However, those skilled in the art will readily appreciate that the detailed description given herein with respect to these Figures is for explanatory purposes only and should not be construed as limiting.

FIG. 1 illustrates a front isometric view of an embodiment of an electronic device 100. As shown, the electronic device 100 may include an enclosure 102, or housing, that defines an internal volume that can carry several internal components including, as non-limiting examples, processing circuitry (such as a central processing unit and a graphics processing unit), memory circuits, circuit boards, an audio component (or components), a microphone (or microphones), a battery, and flexible circuitry that connects together the aforementioned components.

The electronic device 100 may further include a display 104 coupled with the enclosure 102. The display 104 may include a light emitting diode ("LED") display, as a non-limiting example. In order to protect the display 104, the electronic device 100 may further include a transparent layer 106 that covers the display 104. The electronic device 100 may further include a stand 108 that is rotationally coupled to the enclosure 102, thereby allowing enclosure 102, and in particular the display 104, to rotate relative to the stand 108.

Figure 2:
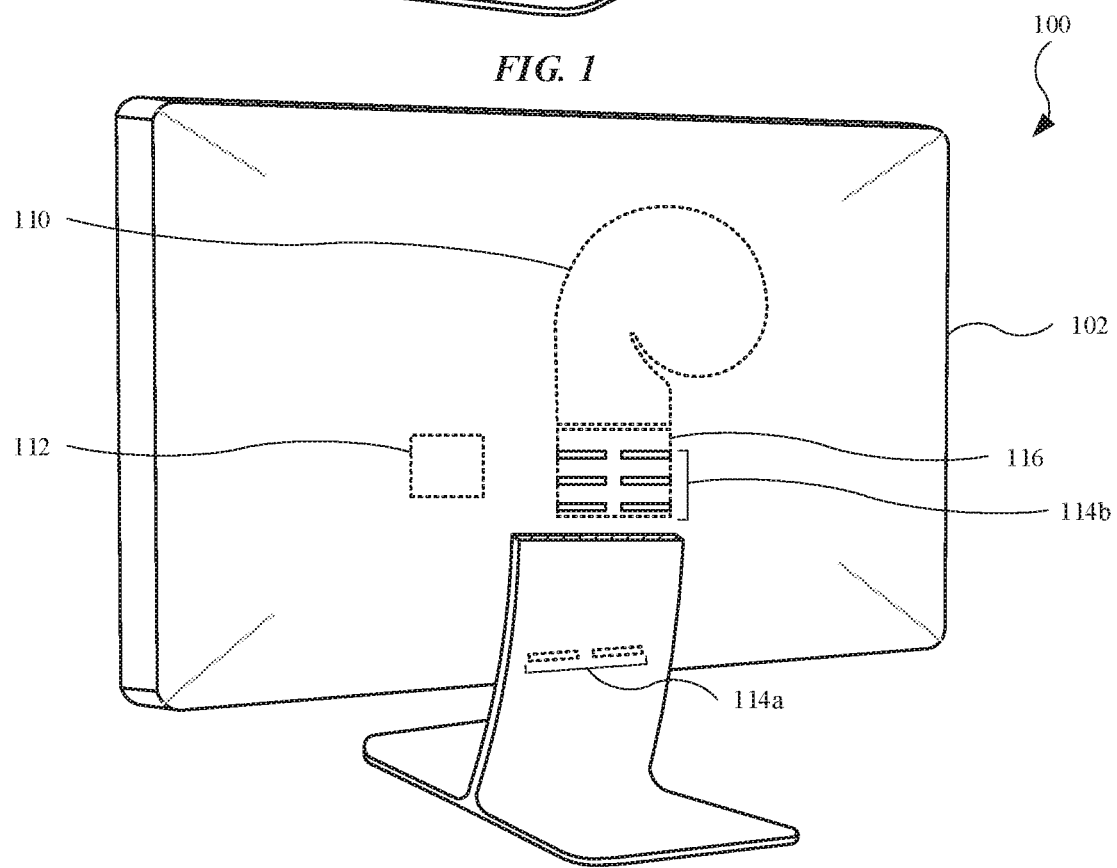
FIG. 2 illustrates a rear isometric view of the electronic device shown in FIG. 1.

FIG. 2 illustrates a rear isometric view of the electronic device shown in FIG. 1. As shown, the electronic device 100 includes a fan assembly 110 and a heat-generating component 112, both of which are positioned in the internal volume of the enclosure 102. For purposes of illustration, the stand 108 is partially removed. The enclosure 102 may include openings 114a, or through holes, used as air inlet vents allowing to enter and circulate within the enclosure 102. During operation of the electronic device 100, the heat-generating component 112 (representative one or more heat-generating components) undergoes a temperature increase and heat the surrounding air within the internal volume. In order to remove at least some of the heated air, the electronic device 100 may activate the fan assembly 110, which directs the heated air away from the heat-generating component 112. Further, the fan assembly 110 can drive the heated air to a heat exchanger 116 that delivers some of the heat generated by the internal components to the airflow. The heat exchanger 116 may be thermally coupled through heat pipes and other means (not shown in FIG. 2) with the heat-generating components within the electronic device 100, and receive heat from those heat-generating components. The heat exchanger 116 can transfer heat to the outlet airflow of the fan assembly 110, which is exhausted to out of the electronic device 100. In this regard, the air may exit from the heat exchanger 116 and pass through openings 114b (formed in the enclosure 102) used as air outlet vents.

As shown, the fan assembly 110 includes a dimension that matches, or at least substantially matches, a dimension of other features of the electronic device 100. For example, a fan outlet (shown and described below) of the fan assembly 110 includes a dimension that is the same or similar to a dimension of the heat exchanger 116, thereby allowing airflow out of the fan outlet to pass through a substantial portion of the heat exchanger 116. Additionally, the fan outlet includes a dimension that is the same or similar to a dimension of a perimeter defined by the openings 114b, thereby allowing airflow that exits out of the heat exchanger 116 to readily pass through the openings 114b.

In order to activate and deactivate the fan assembly 110, the processing circuitry can provide a signal to turn on the fan assembly 110 and terminate the signal to turn off the fan assembly 110. The input information provided to the processing circuitry may include one or more temperature sensors (not shown in FIG. 2) that determine(s) the temperature of the components within the internal volume of the enclosure 102. As a result, when a threshold temperature is reached or exceeded, the processing circuitry can provide the signal to turn on the fan assembly 110. Alternatively, or in combination, the input information provided to the processing circuitry may include an amount of time the heat-generating component 112 is in use. For example, after 10 minutes of operation of the heat-generating component 112, the processing circuitry can provide the signal to turn on the fan assembly 110. The time is intended to be exemplary only, and a different time (or times) may be used.

Figure 3:
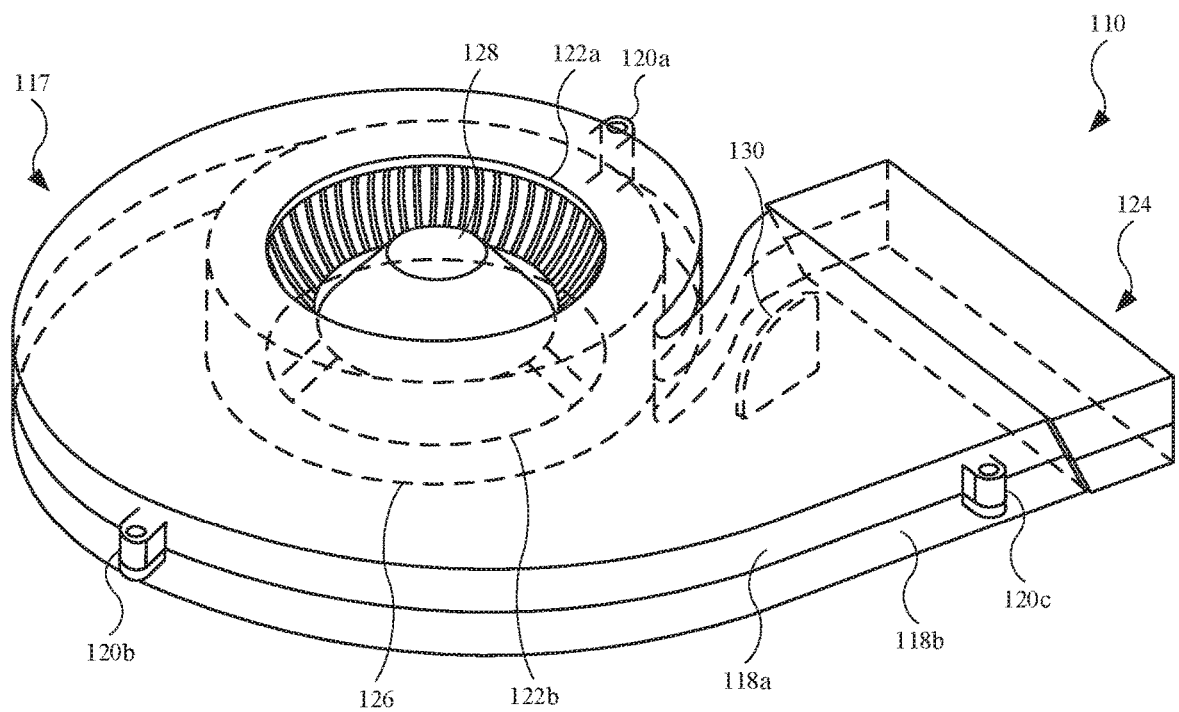
FIG. 3 illustrates an isometric view of an embodiment of a fan assembly, in accordance with some described embodiments.

FIG. 3 illustrates an isometric view of an embodiment of a fan assembly 110, in accordance with some described embodiments. As shown, the fan assembly 110 includes a fan housing 117. The fan housing 117 may include a housing part 118a and a housing part 118b that is coupled to the housing part 118a. The housing part 118a and the housing part 118b may be referred to as a first housing part and a second housing part, respectively. In order to secure the fan assembly 110 to the enclosure 102 (shown in FIGS. 1 and 2), or some other structure within the enclosure 102, the fan housing 117 includes mounting features, such as a mounting feature 120a, a mounting feature 120b, and a mounting feature 120c. Each mounting feature may include an opening that allows a fastener (not shown in FIG. 3) to pass through and secure to a structure, such as the enclosure 102 (shown in FIGS. 1 and 2). While the fan housing 117 is shown as a two-piece structure, the number of pieces can vary.

The fan assembly 110 further includes a fan inlet 122a and a fan inlet 122b, each of which provide a pathway for air into the fan assembly 110. The fan inlet 122a and the fan inlet 122b may be referred to as a first fan inlet and a second fan inlet, respectively. As shown, the fan inlet 122a and the fan inlet 122b are formed in the housing part 118a and the housing part 118b, respectively. The fan assembly 110 further includes a fan outlet 124 that is defined by the housing part 118a and the housing part 118b. The fan inlet 122a and the fan inlet 122b may each include a circular fan inlet and the fan outlet 124 may include a rectangular fan outlet. However, other shapes are possible. The fan assembly 110 further includes an impeller 126. The impeller 126 may include several blades (not labeled) connected to an impeller hub 128. The number of blades of the impeller 126 may be approximately in the range of 25-100 blades. The fan assembly 110 further includes a motor (shown below) with a shaft (capable of rotation) that is coupled to the impeller 126 via the impeller hub 128. During operation, the motor rotationally drives the impeller 126, including the blades. When integrated into the electronic device 100 (shown in FIGS. 1 and 2), the impeller 126, when rotationally driven, draws heated air into the fan housing 117 via the fan inlet 122a and the fan inlet 122b, which then passes through the fan housing 117 and out of the fan outlet 124.

In some instances, the air undergoes irregular motion within the fan housing 117. For instance, the air may undergo flow separation prior to exiting the fan outlet 124. As a result, the air may recirculate in direction opposite to what is shown in FIG. 3, thereby causing non-uniform flow out of the fan outlet 124 as well as pressure loss. Further, recirculation may increase the turbulence level at the fan outlet 124, thereby causing increased acoustic noise. In order to limit or prevent flow separation, the fan assembly 110 may include a guide vane 130 located in the fan housing 117. The guide vane 130 is designed and positioned within the fan housing 117 to direct air that is received by the fan housing 117 such that the air is subsequently driven out of the fan housing 117 through the fan outlet 124, while limiting or preventing flow separation within the fan housing 117. This will be further discussed below.

Figure 4:
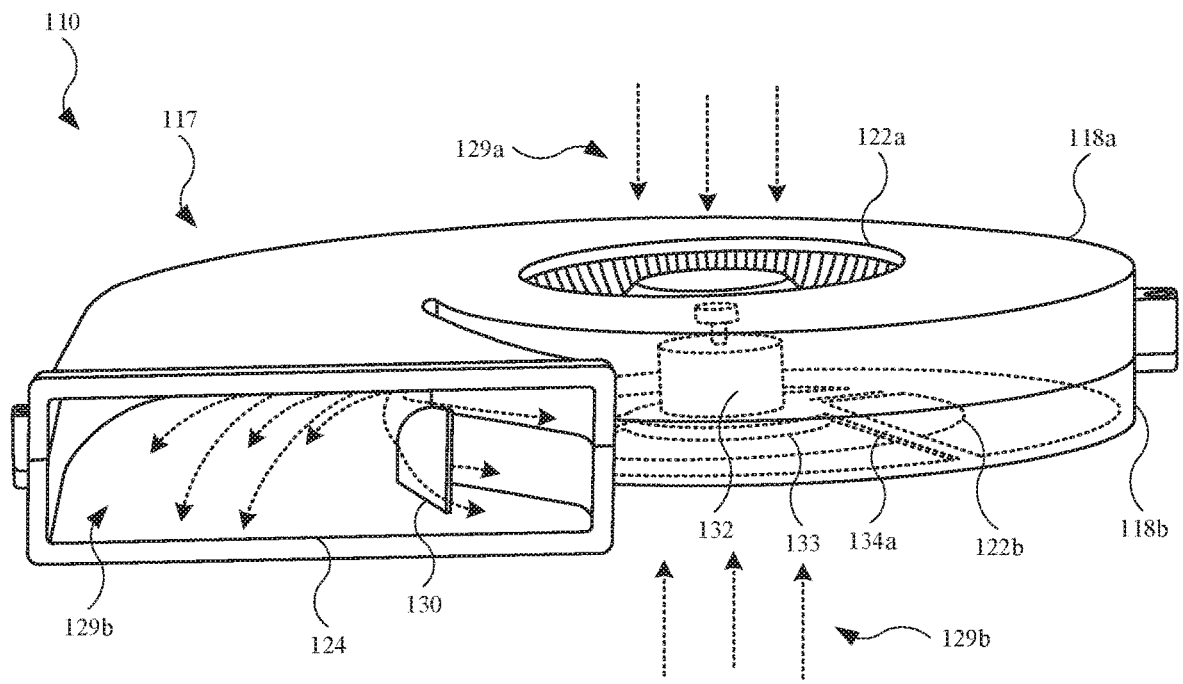
FIG. 4 illustrates an alternate isometric view of the fan assembly shown in FIG. 3, showing an exemplary movement of airflow through the fan assembly, in accordance with some described embodiments.

FIG. 4 illustrates an alternate isometric view of the fan assembly 110 shown in FIG. 4, showing an exemplary movement of airflow through the fan assembly 110, in accordance with some described embodiments. The fan assembly 110 may include a motor 132 used to drive the impeller 126 (shown in FIG. 3). In order to support the motor 132, the housing part 118b includes a platform 133 that supports/carries the motor 132, as well as several struts connected to the platform 133. A strut 134a, representing additional struts, is shown.

When the impeller 126 is rotationally driven by the motor 132, airflow (represented by arrows 129a) enters the fan inlet 122a and airflow (represented by arrows 129b) enters the fan inlet 122b. Based upon the location of the motor 132, the platform 133, and the struts being closer to the fan inlet 122b than the fan inlet 122a, the airflow into the fan inlet 122b is restricted as compared to the airflow into the fan inlet 122a, resulting in less airflow and/or slower air velocity through the housing part 118b as compared to the housing part 118a. This may lead to airflow separation within the fan housing 117. Further, the modification of the fan outlet 124 to match the dimension of the openings 114b and the heat exchanger 116 (both shown in FIG. 2) can further contribute to the airflow separation. In some instances, the airflow separation further contributes to airflow turbulence in the fan housing 117, thereby causing the air to recirculate rather than directly exit the fan outlet 124, particularly in locations associated with the housing part 118b.

However, the guide vane 130 is integrated and positioned in the housing part 118b to limit or prevent the undesirable airflow separation. The guide vane 130 is integrated with the housing part 118b, i.e., the same housing part as that of the components (the motor 132, the platform 133, and the struts) that can restrict airflow. In this manner, the guide vane 130, based on its location, alters at least some of the air traveling through the housing part 118b such that airflow separation and the subsequent recirculation and turbulence are limited or prevented. In this manner, the guide vane 130 can mitigate issues related to flow differences between air entering the fan inlet 122a and the fan inlet 122b. Meanwhile, the air traveling through the housing part 118a can pass over the guide vane 130. Accordingly, the guide vane 130 is not in contact with the housing part 118a, and offers minimal or no flow impedance of air flowing in locations associated with the housing part 118a.

The guide vane 130 not only promotes additional airflow through the fan assembly 110, but can also reduce the amount noise generated by the fan assembly 110. For instance, the noise generated by the fan assembly 110 is proportional to the speed (in RPM) of the impeller 126 (in RPM) shown in FIG. 3. When the fan assembly 110, having the guide vane 130, runs at relatively lower speeds and drives the same amount of air as fan assemblies without a guide vane 130, the noise generation by the fan assembly 110 may appear lower to a user. As a result, the guide vane 130 drives the air through the fan assembly 110 such that the speed of the impeller 126 does not need to increase to compensate/offset irregular motion of the air in the fan assembly 110, and the overall efficiency of the fan assembly 110 improves.

In order to integrate the guide vane 130 with the housing part 118b, a molding cavity (not shown in FIG. 4) is used to form the housing part 118b can be modified to include a cavity that corresponds to the size and shape of the guide vane 130. This allows the material used to form the housing part 118b to flow into the molding cavity such that the guide vane 130 is integrally formed with the housing part 118b, thereby forming a monolithic structure. It should be noted that the housing part 118a, in addition to the housing part 118b, can also be formed by a molding operation.

Figure 5:
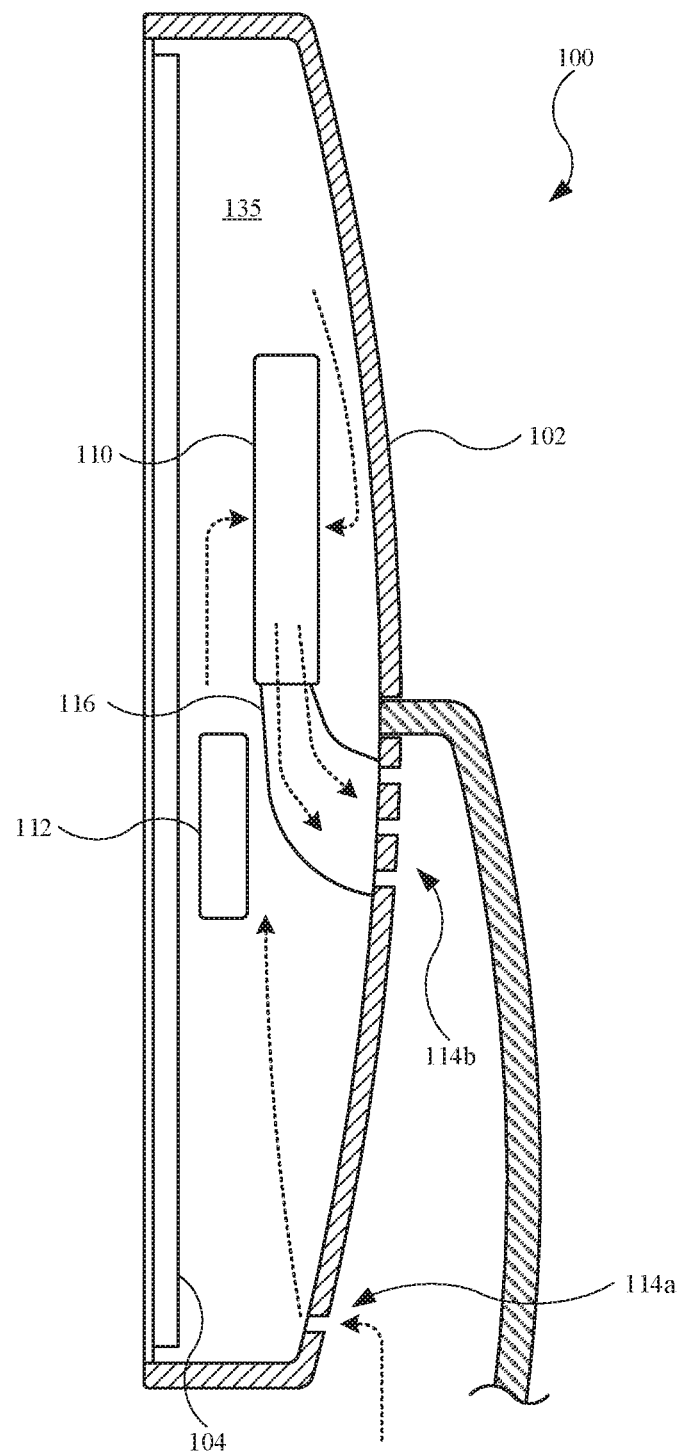
FIG. 5 illustrates a partial cross sectional view of the electronic device shown in FIG. 1.

FIG. 5 illustrates a partial cross sectional view of the electronic device 100 shown in FIG. 1. The dotted lines with arrows represent airflow. As shown, ambient air may enter the enclosure 102 via openings 114a and circulate throughout an internal volume 135 defined by the enclosure 102. The entering air may pass along and convectively cool the display 104 and/or the heat-generating component 112. The air may then enter the fan assembly 110 (the details which are previously described), where the fan assembly 110 subsequently directs the air to the heat exchanger 116. The heat exchanger 116 may provide the primary cooling function for the electronic device 100, while the passage of the air between the openings 114a, or inlet openings, of the enclosure 102 and the inlets of the fan assembly 110 (shown in FIG. 4) provides complementary cooling. Although the temperature of the air exiting the fan assembly 110 may be higher than that of the ambient air, the air flowing out of the fan assembly 110 may nonetheless cool the heat exchanger 116, as the temperature of the heat exchanger 116 may be higher than that of the air received from the fan outlet of the fan assembly 110. Also, although not shown, the electronic device 100 may further include heat pipes that are thermally coupled to the heat exchanger 116.

Figure 6:
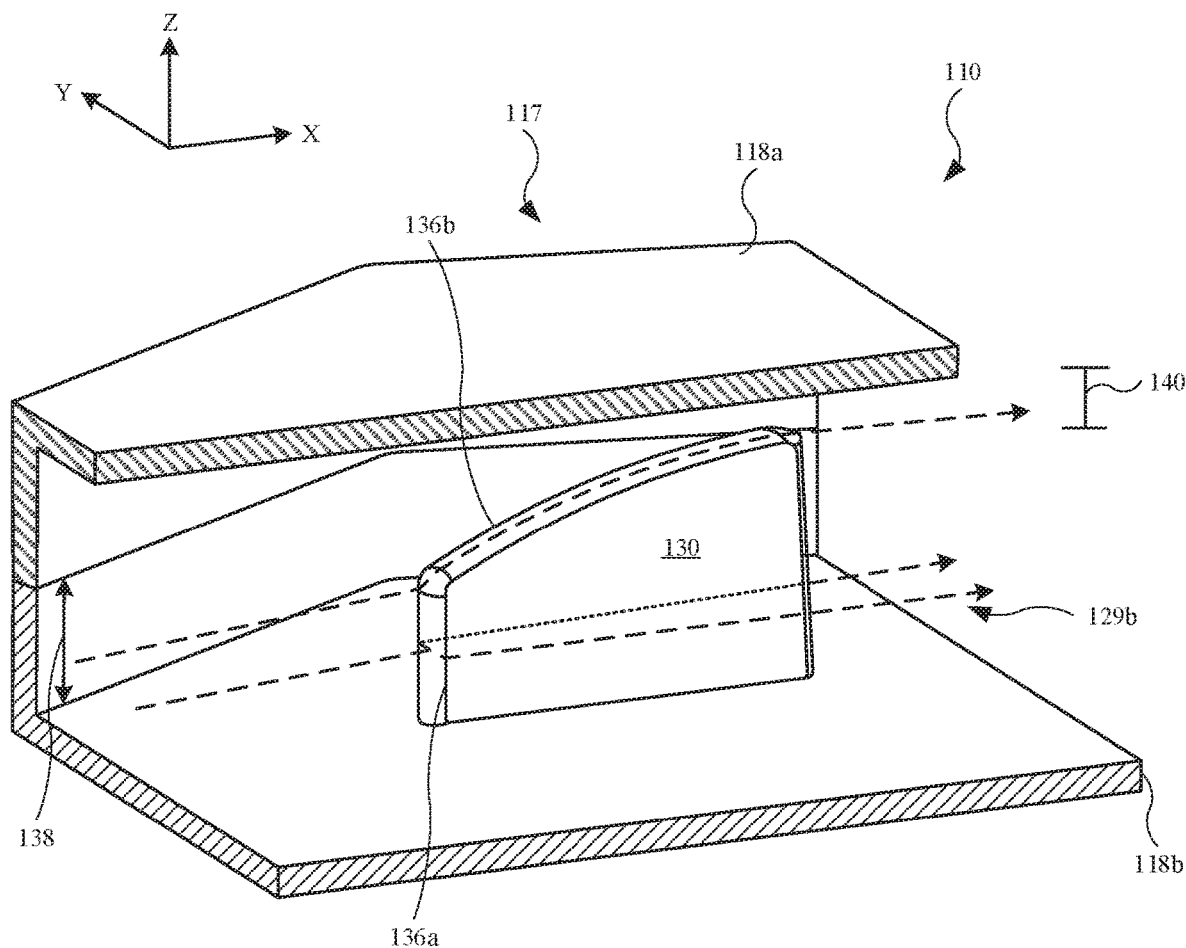
FIG. 6 illustrates a partial cross sectional view of the fan assembly, showing the guide vane and airflow in relation to the guide vane, in accordance with some described embodiments.

FIG. 6 illustrates a partial cross sectional view of the fan assembly 110, showing the guide vane 130 and airflow in relation to the guide vane 130, in accordance with some described embodiments. As shown, the guide vane 130 may include a linear region 136a, or straight region, and a tapered region 136b, or curved region. The linear region 136a extends from the housing part 118b and transitions to the tapered region 136b. The linear region 136a may include multiple straight edges to define a rectangular portion, while the tapered region 136b is an arched, i.e., non-linear. Also, the dimension of the linear region 136a may be the same as, or at least substantially similar to, an internal height 138 of the housing part 118b. While the outer perimeter of the guide vane 130 may differ based in part on the linear region 136a and the tapered region 136b, the guide vane 130 may generally include a uniform thickness along the Y-axis, or at least an approximately uniform thickness. The thickness of the guide vane 130 may be approximately in the range of 0.3 to 1 millimeters ("mm"). In some embodiments, the thickness of the guide vane 130 is 0.5 mm. While the guide vane 130 includes a substantially uniform thickness, both the leading edge and the trailing edge of the guide vane 130 may include rounded (or semi-circular) edges, as shown in FIG. 6 in order to reduce the aerodynamic drag of the guide vane 130.

As shown, at least some of the air (represented by the arrows 129b) received by the housing part 118b can flow laterally around the linear region 136a of the guide vane 130, while at least some of the air (represented by the arrows 129b) received by the housing part 118a can flow over the tapered region 136b of the guide vane 130. The tapered region 136b can limit or prevent the interaction of the low and high air pressure regions on opposing surfaces of the guide vane 130, which may otherwise lead to the formation of a tip vortex, which may in turn disturb the airflow downstream of the guide vane 130 and act as a source of acoustic noise. Also, in order to prevent unwanted contact between the housing part 118a and the guide vane 130, a clearance 140, or dimension/distance, between a lower surface of the housing part 118a and an uppermost point of the guide vane 130 is established. The clearance 140 represents a space that prevents contact between the housing part 118a and the guide vane 130, even during instances when this housing part 118a is engaged with another internal component of the electronic device 100 (shown in FIGS. 1 and 2) and/or when the housing part 118a undergoes a vibration event, for example, when a speaker (not shown in FIG. 6) is generating acoustical sound.

Figure 7:
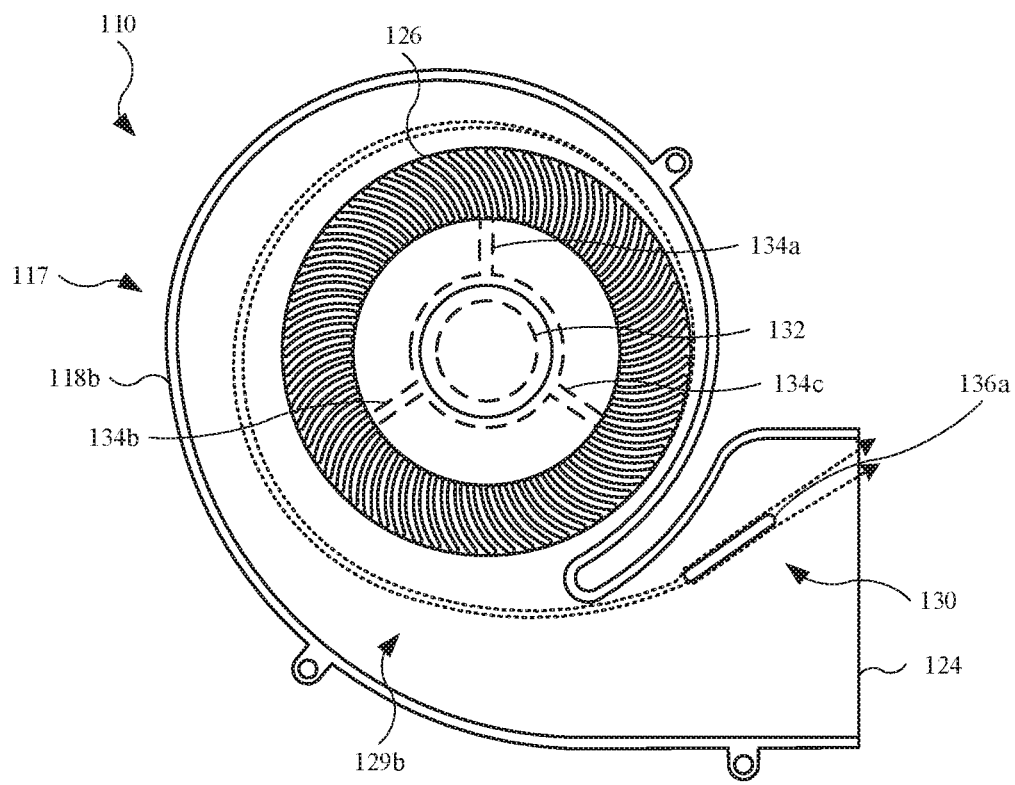
FIG. 7 illustrates a plan view of the fan assembly, showing airflow passing along a lower portion of the fan assembly, in accordance with some described embodiments.
Figure 8:
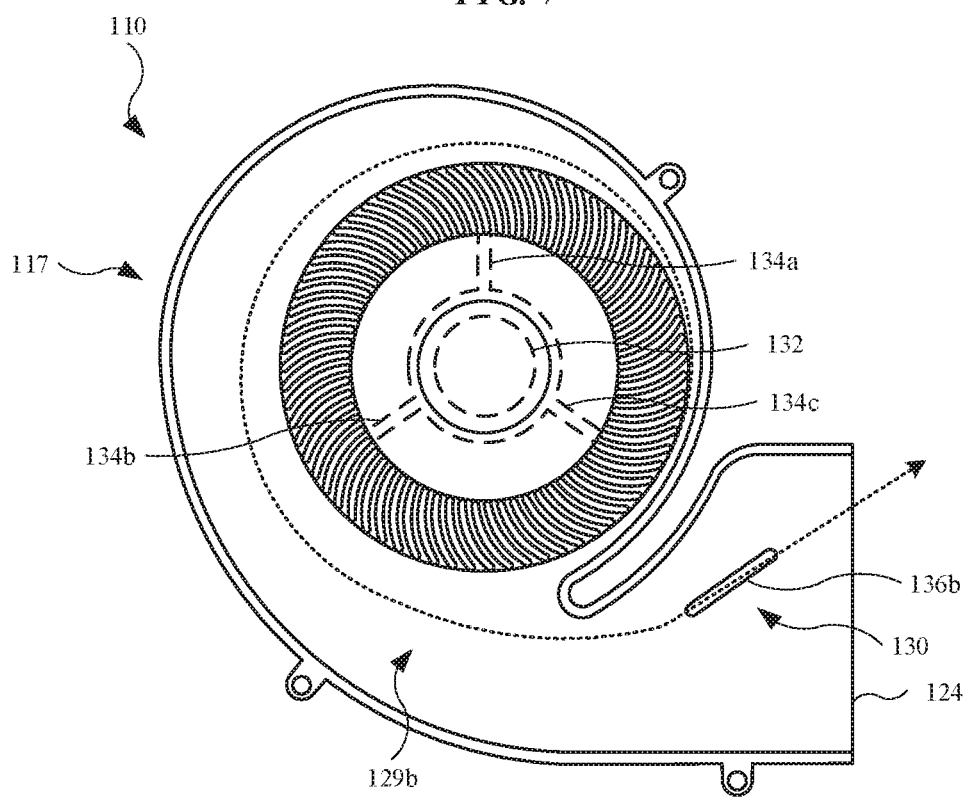
FIG. 8 illustrates a plan view of the fan assembly, showing airflow passing along an upper portion of the fan assembly, in accordance with some described embodiments.

FIGS. 7 and 8 show the air flowing through the fan assembly 110 at different elevations within the fan housing 117, and further illustrate the differences in airflow within the fan assembly 110 based in part on the location of the motor 132, the strut 134a, the strut 134b, and the strut 134c. For purposes of illustration, the housing part 118a is removed from the fan assembly 110. FIGS. 7 and 8.

FIG. 7 illustrates a plan view of the fan assembly 110, showing airflow passing along a lower portion of the fan assembly 110, in accordance with some described embodiments. The "lower portion" may refer to a region defined by the housing part 118b, and in particular, a location in which the air interacts with the linear region 136a of the guide vane 130. As shown, the impeller 126 drives the air (represented by the arrows 129b) within the fan housing 117 to the fan outlet 124. The guide vane 130 is designed to direct the air to the fan outlet 124 prior to the air undergoing, or at least prior to substantially undergoing, separation.

FIG. 8 illustrates a plan view of the fan assembly 110, showing airflow passing along an upper portion of the fan assembly 110, in accordance with some described embodiments. The "upper portion" may refer to a region defined by a location substantially defined by the housing part 118a (not shown in FIG. 8), and in particular, a location in which the air interacts with the tapered region 136b of the guide vane 130 or a location that passes over the guide vane 130. As shown, the impeller 126 drives the air (represented by the arrows 129b) within the fan housing 117 to the fan outlet 124.

FIGS. 9-12 show and describe different embodiments of guide vanes that are suitable for use in fan assemblies described herein. As a result, in some instances, the guide vanes shown and described in FIGS. 9-12 can substitute for the guide vane 130 (shown in prior Figures). Further, the fan assemblies shown and described in FIGS. 9-12 may include features described herein for the fan assembly 110 (shown in prior Figures), and may be integrated with any electronic device described herein.

Figure 9:
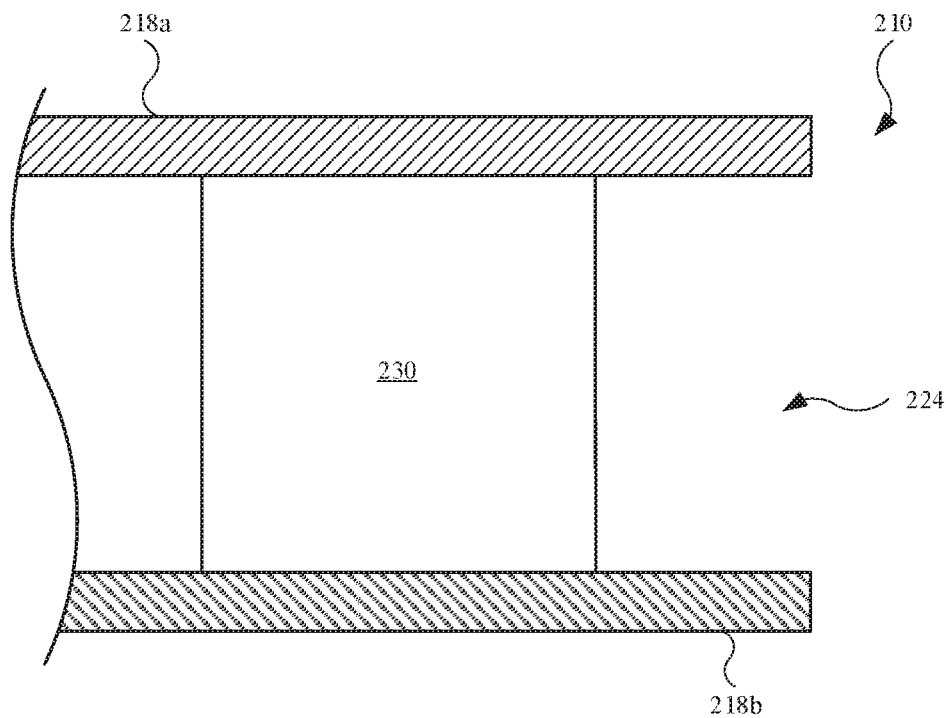
FIG. 9 illustrates a partial cross section of an alternate embodiment of a fan assembly, showing the fan assembly that includes a guide vane in contact with multiple housing parts, in accordance with some described embodiments.

FIG. 9 illustrates a partial cross section of an alternate embodiment of a fan assembly 210, showing the fan assembly 210 that includes a guide vane 230 in contact with multiple housing parts, in accordance with some described embodiments. As shown, the fan assembly 210 includes a housing part 218a and a housing part 218b, and a fan outlet 224 defined by the housing part 218a and the housing part 218b. The guide vane 230 may be integrally formed with the housing part 218a or the housing part 218b. In either event, the guide vane 230 may include a size and shape that allows the guide vane 230 to engage both the housing part 218a and the housing part 218b, thereby creating additional surface area and allowing the guide vane 230 to direct additional air that passes through the fan assembly 210 to the fan out let 224.

Figure 10:
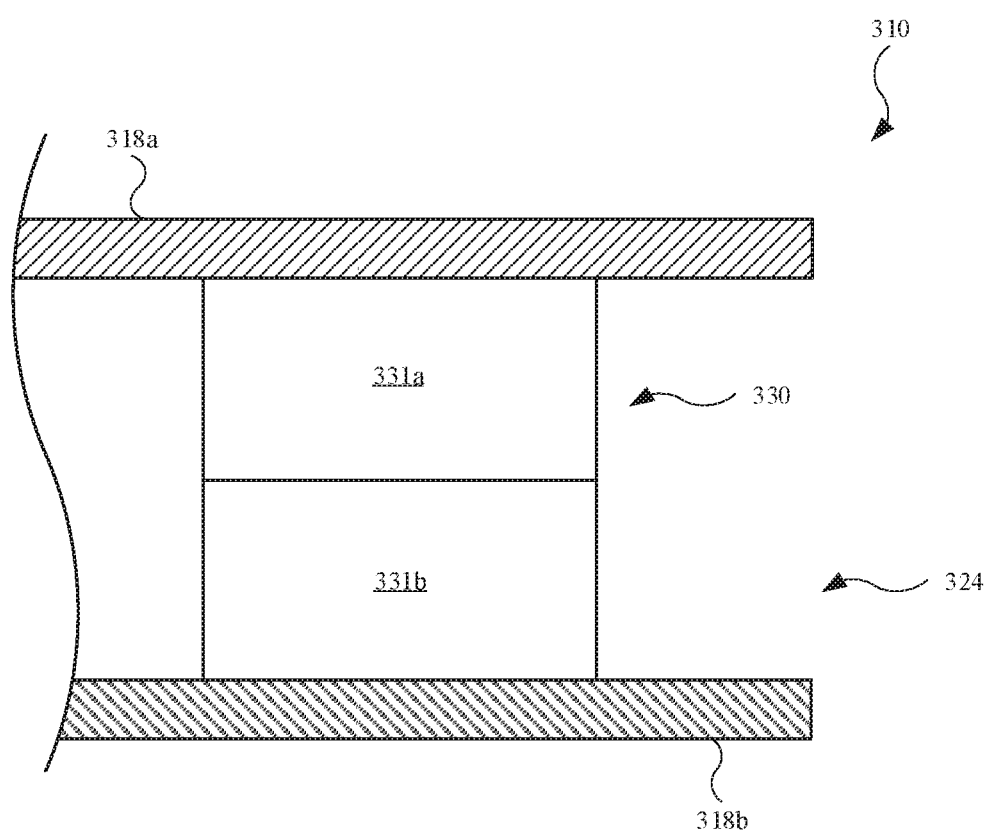
FIG. 10 illustrates a partial cross section of an alternate embodiment of a fan assembly, showing the fan assembly that includes a guide vane with multiple sections, and with each section integrated with a housing part of the fan assembly, in accordance with some described embodiments.

FIG. 10 illustrates a partial cross section of an alternate embodiment of a fan assembly 310, showing the fan assembly 310 that includes a guide vane 330 with multiple sections, with each section integrated with a housing part of the fan assembly 310, in accordance with some described embodiments. As shown, the fan assembly 310 includes a housing part 318a and a housing part 318b, and a fan outlet 324 defined by the housing part 318a and the housing part 318b. The guide vane 330 may include a first section 331a and a second section 331b integrally formed with the housing part 318a and the housing part 318b, respectively. A dual section guide vane, represented in FIG. 10, may provide additional alignment capabilities during assembly of the fan assembly 310. Although not shown, the guide vane 330 can be constructed/modified such that the first section 331a is not in contact with the second section 331b. Also, the guide vane 330 can be further constructed/modified such that only the first section 331a or the second section 331b is present.

Figure 11:
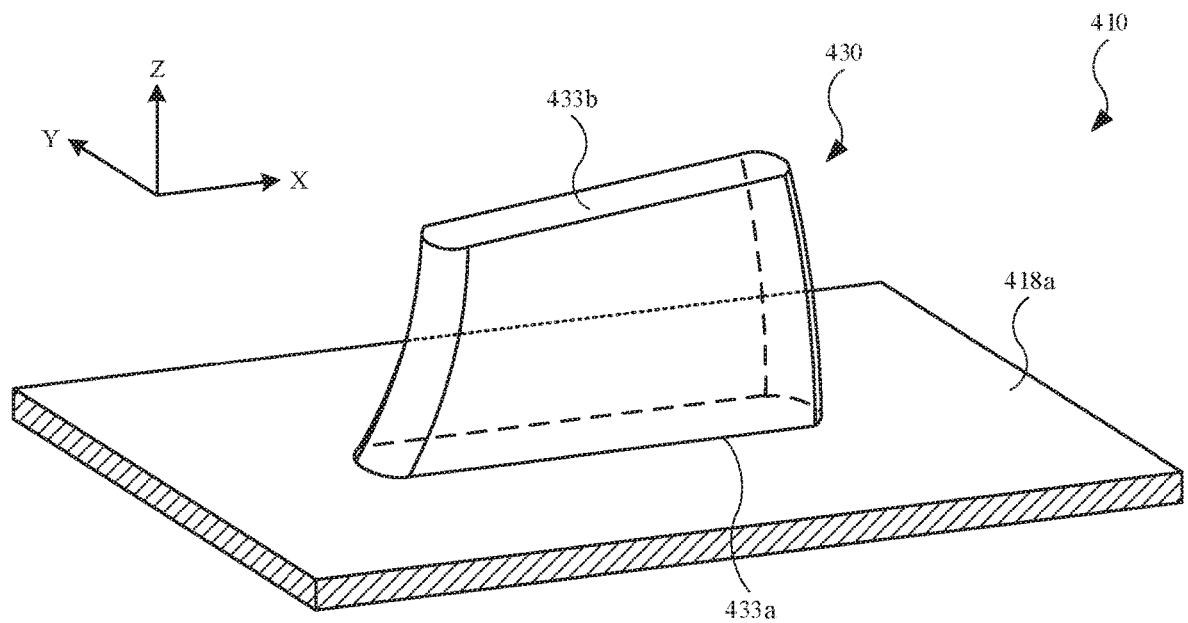
FIG. 11 illustrates a partial cross section of an alternate embodiment of a fan assembly, showing the fan assembly that includes a guide vane having a twisted configuration, in accordance with some described embodiments.

FIG. 11 illustrates a partial cross section of an alternate embodiment of a fan assembly 410, showing the fan assembly 410 that includes a guide vane 430 having a twisted configuration, in accordance with some described embodiments. While the fan assembly 410 includes a housing part 418a, and additional housing part (parallel to the housing part 418a) may be included in the fan assembly 410 but is removed for purposes of illustration. Based on the twisted configuration, the guide vane 430 may include a surface 433a engaged with the housing part 418a along an X-Y plane, and a surface 433b that is rotated with respect to the surface 433a along an X-Y plane. Accordingly, the guide vane 430 is twisted along the Z-axis. The twist angle between the surface 433a and the surface 433b is approximately in the range of 5-15 degrees. In some embodiments, the twist angle between the surface 433a and the surface 433b is 10 degrees. With a twisted configuration, the guide vane 430 may be aligned more closely with the local direction of the air flowing through the fan assembly 410 in additional directions, as compared to prior embodiments of guide vanes. While the guide vane 430 includes a substantially uniform thickness, both the leading edge and the trailing edge of the guide vane 430 may include rounded (or semi-circular) edges, as shown in FIG. 11.

Figure 12:
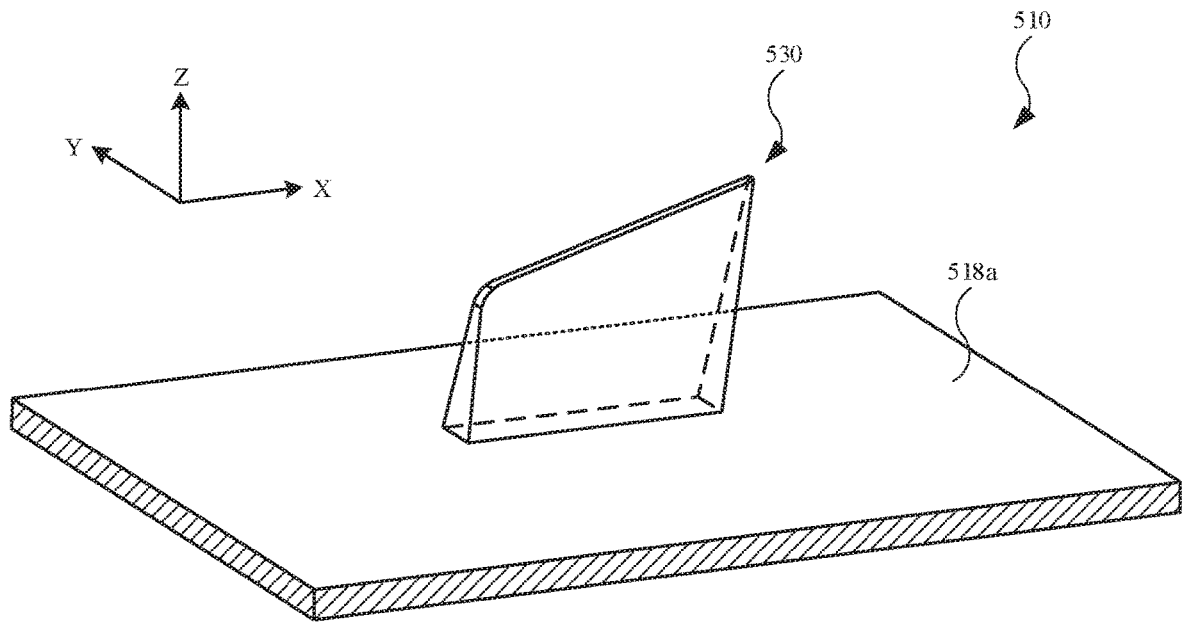
FIG. 12 illustrates a partial cross section of an alternate embodiment of a fan assembly, showing the fan assembly including a guide vane having a variable thickness (wedge-shaped geometry), in accordance with some described embodiments.

FIG. 12 illustrates a partial cross section of an alternate embodiment of a fan assembly 510, showing the fan assembly 510 including a guide vane 530 having a variable thickness (wedge-shaped geometry), in accordance with some described embodiments. While the fan assembly 510 includes a housing part 518a, an additional housing part (parallel to the housing part 518a) may be included in the fan assembly 510 but is removed for purposes of illustration. The variable thickness (wedge-shaped geometry) feature is added as a draft to facilitate detachment of the molded part (i.e., the housing part 518a) from the mold, if the fan housing part with an integrated guide vane is manufactured by molding.

While the prior embodiments of guide vanes are integrally formed with their respective housing parts, in some embodiments, the guide vanes may be hinged or include elastic materials or regions of elasticity. This may allow the guide vane to adjust to pressure differences by weathervaning, flexing, or bending during operation of their respective fan assembly.

Figure 13:
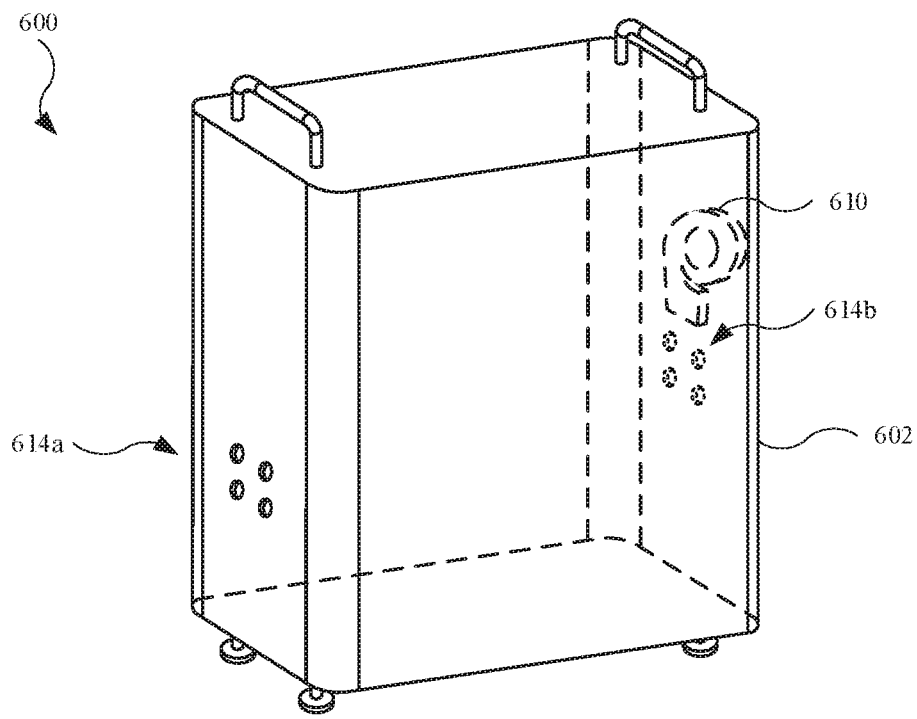
FIG. 13 illustrates an isometric view of an alternate embodiment of an electronic device, in accordance with some described embodiments.
Figure 14:
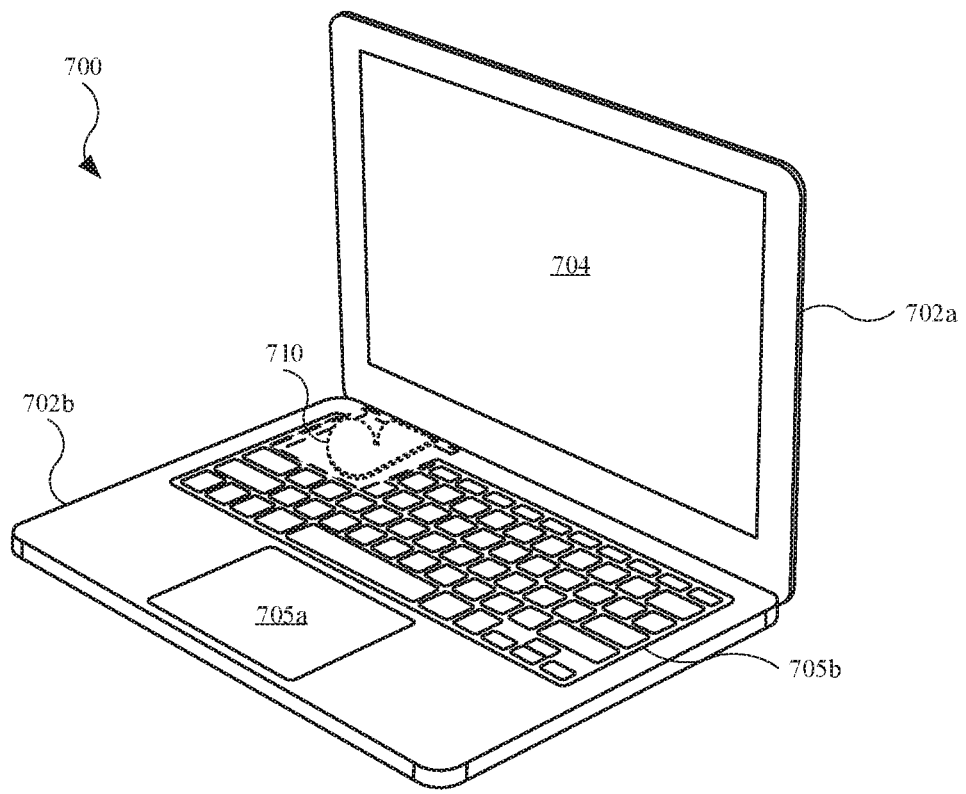
FIG. 14 illustrates an isometric view of an alternate embodiment of an electronic device, in accordance with some described embodiments.

FIGS. 13 and 14 show and describe additional electronic devices that may integrate any of the fan assemblies shown and described herein. The fan assemblies shown and described in FIGS. 13 and 14 may include any designs, shapes, and/or features shown and described for the fan assembly 110 (shown in prior Figures). Also, the electronic devices shown and described in FIGS. 13 and 14 may include any features described herein for the electronic device 100 (shown in FIGS. 1 and 2).

FIG. 13 illustrates an isometric view of an alternate embodiment of an electronic device 600, in accordance with some described embodiments. The electronic device 600 may include a desktop, or "tower," computing device designed for use with a display and other accessories (not shown in FIG. 13), such as a display/monitor, a mouse, and/or a keyboard. As shown, the electronic device 600 includes an enclosure 602, or housing, that defines an internal volume that can carry several internal components including, as non-limiting examples, processing circuitry (such as a central processing unit and a graphics processing unit), memory circuits, circuit boards, an audio component (or components), a microphone (or microphones), a battery, and flexible circuitry that connects together the aforementioned components. The electronic device 600 includes a fan assembly 610 that can draw the heated air away from one or more heat-generating components (not shown in FIG. 13) of the electronic device 600. Further, the fan assembly 610 can receive ambient air via openings 614a formed in the enclosure 602, and subsequently drive the heated air out of the enclosure 602 via openings 614b formed in the enclosure 602. As a result, the fan assembly 610 can reduce the temperature of the components within the internal volume of the enclosure 602.

FIG. 14 illustrates an isometric view of an alternate embodiment of an electronic device 700, in accordance with some described embodiments. The electronic device 700 may include a laptop computing device. As shown, the electronic device 700 includes a housing part 702a and a housing part 702b, also referred to as display housing and a base portion, respectively. The housing part 702a and the housing part 702b may be rotationally coupled to each other to allow relative movement between the housing parts.

The housing part 702a may carry a display 704. The housing part 702b may carry an input mechanism 705a and an input mechanism 705b. The input mechanism 705a and the input mechanism 705b may include a touch pad and a keyboard, respectively. Further, the housing part 702b may define an internal volume that can carry several internal components including, as non-limiting examples, processing circuitry (such as a central processing unit and a graphics processing unit), memory circuits, circuit boards, an audio component (or components), a microphone (or microphones), a battery, and flexible circuitry that electrically connects together the aforementioned components. As shown in a partial cross section, the electronic device 700 may include a fan assembly 710 located in the housing part 702b. The fan assembly 710 can draw the heated air away from one or more heat-generating components (not shown in FIG. 14) of the electronic device 700. Further, the fan assembly 710 can receive ambient air via openings (not shown in FIG. 14) formed in the housing part 702b, and subsequently drive the heated air out of the housing part 702b via openings (not shown in FIG. 14) formed in the housing part 702b. As a result, the fan assembly 710 can reduce the temperature of the components within the internal volume of the housing part 702b.

Figure 15:
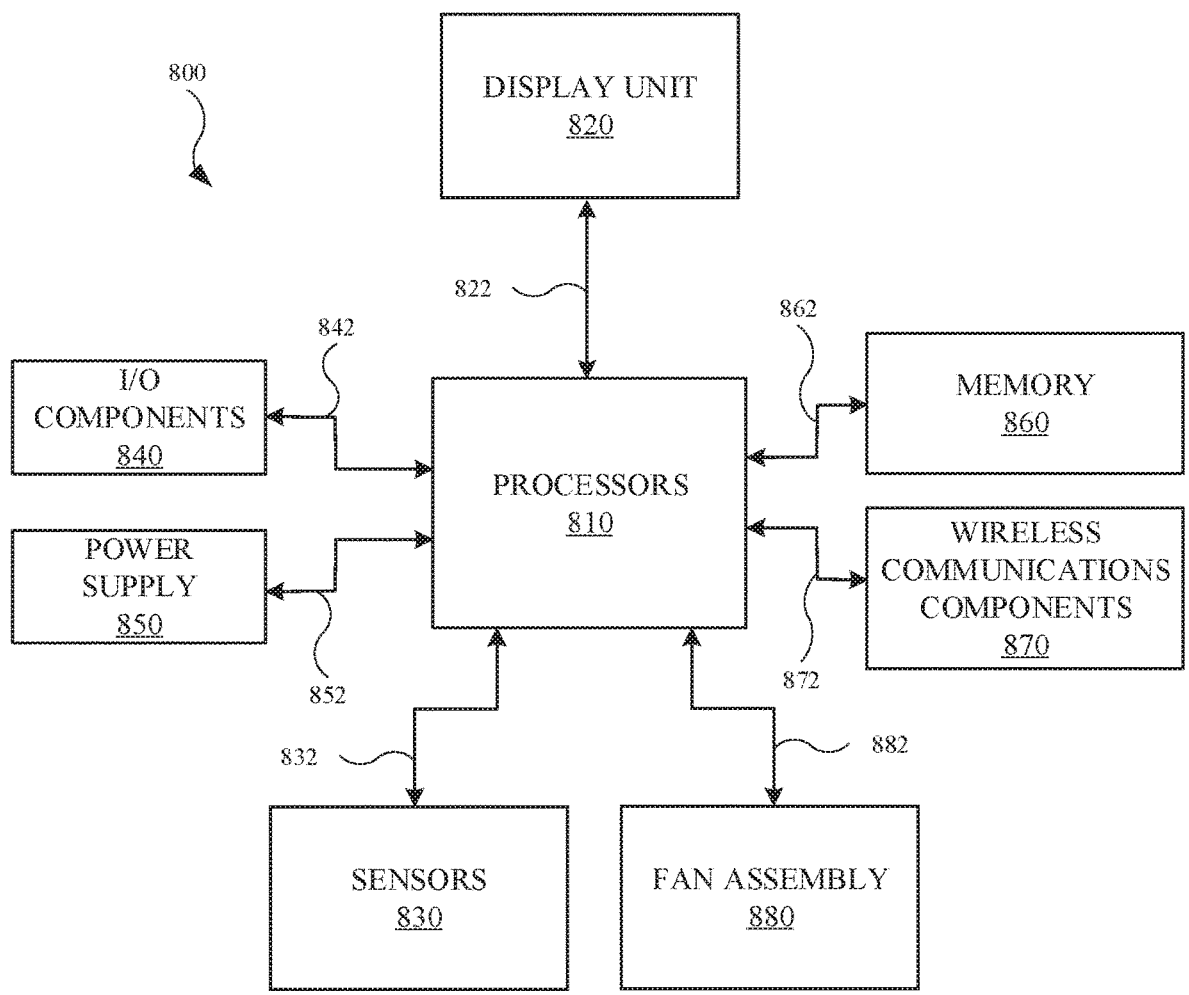
FIG. 15 illustrates a block diagram of an electronic device, in accordance with some described embodiments.

FIG. 15 illustrates a block diagram of an electronic device 800, in accordance with some described embodiments. The features in the electronic device 800 may be present in other electronic devices described herein. The electronic device 800 may include one or more processors 810 for executing functions of the electronic device 800. The one or more processors 810 can refer to at least one of a central processing unit (CPU) and at least one microcontroller for performing dedicated functions. Also, the one or more processors 810 can refer to application specific integrated circuits.

According to some embodiments, the electronic device 800 can include a display unit 820. The display unit 820 is capable of presenting a user interface that includes icons (representing software applications), textual images, and/or motion images. In some examples, each icon can be associated with a respective function that can be executed by the one or more processors 810, In some cases, the display unit 820 includes a display layer (not illustrated), which can include a liquid-crystal display (LCD), light-emitting diode display (LED), or the like. According to some embodiments, the display unit 820 includes a touch input detection component and/or a force detection component that can be configured to detect changes in an electrical parameter (e.g., electrical capacitance value) when the user's appendage (acting as a capacitor) comes into proximity with the display unit 82 (or in contact with a transparent layer that covers the display unit 820). The display unit 820 is connected to the one or more processors 810 via one or more connection cables 822.

According to some embodiments, the electronic device 800 can include one or more sensors 830 capable of provide an input to the one or more processors 810 of the electronic device 800. The one or more sensors 830 may include a temperature sensor, as a non-limiting example. The one or more sensors 830 is/are connected to the one or more processors 810 via one or more connection cables 832.

According to some embodiments, the electronic device 800 can include one or more input/output components 840. In some cases, the one or more input/output components 840 can refer to a button or a switch that is capable of actuation by the user. When the one or more input/output components 840 are used, the one or more input/output components 840 can generate an electrical signal that is provided to the one or more processors 810 via one or more connection cables 842.

According to some embodiments, the electronic device 800 can include a power supply 850 that is capable of providing energy to the operational components of the electronic device 800. In some examples, the power supply 850 can refer to a rechargeable battery. The power supply 850 can be connected to the one or more processors 810 via one or more connection cables 852. The power supply 850 can be directly connected to other devices of the electronic device 800, such as the one or more input/output components 840. In some examples, the electronic device 800 can receive power from another power sources (e.g., an external charging device) not shown in FIG. 15.

According to some embodiments, the electronic device 800 can include memory 860, which can include a single disk or multiple disks (e.g., hard drives), and includes a storage management module that manages one or more partitions within the memory 860. In some cases, the memory 860 can include flash memory, semiconductor (solid state) memory or the like. The memory 860 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of the electronic device 800. In some embodiments, the memory 860 refers to a non-transitory computer readable medium. The one or more processors 810 can also be used to execute software applications. In some embodiments, a data bus 862 can facilitate data transfer between the memory 860 and the one or more processors 810.

According to some embodiments, the electronic device 800 can include wireless communications components 870. A network/bus interface 872 can couple the wireless communications components 870 to the one or more processors 810. The wireless communications components 870 can communicate with other electronic devices via any number of wireless communication protocols, including at least one of a global network (e.g., the Internet), a wide area network, a local area network, a wireless personal area network (WPAN), or the like. In some examples, the wireless communications components 870 can communicate using NFC protocol, BLUETOOTH® protocol, or WIFI® protocol.

According to some embodiments, the electronic device 800 can include a fan assembly 880. The fan assembly 880 is designed to remove heat from one or more heat-generating components of the electronic device 800, such as the one or more processors 810. The fan assembly 880 may include modifications such as a guide vane. In some embodiments, one or more cables 882 can facilitate signals between the fan assembly 880 and the one or more processors 810. As a result, the one or more processors 810 may use information from the sensors 830 to control the fan assembly 880.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   an enclosure that defines an internal volume; and
   a fan assembly positioned in the internal volume, the fan assembly comprising:
     a fan housing comprising a first housing part and a second housing part that combines with the first housing part to define one or more fan inlets and a fan outlet, the second housing part comprising a sidewall coupled with the first housing part, the sidewall having a first height,
     an impeller that drives air into the one or more fan inlets, and
     a guide vane positioned in the fan housing and covered by the first housing part and the second housing part, the guide vane comprising a tapered region that faces away from the fan outlet, wherein at least some of the air received by the impeller is directed by the guide vane prior to passing through the fan outlet, wherein the guide vane comprises a second height greater than the first height.

2. The electronic device of claim 1, wherein the tapered region faces at least some of the air driven by the impeller.

3. The electronic device of claim 1, wherein the one or more fan inlets comprise a first through hole formed in the first housing part and a second through hole formed in the second housing part, and the guide vane extends from the second housing part.

4. The electronic device of claim 1, further comprising:
   a display secured with the enclosure;
   a transparent protective cover that overlays the display; and
   a stand, wherein the enclosure is rotationally coupled with the stand.

5. The electronic device of claim 1, wherein the enclosure comprises an opening, and wherein the air is directed from the fan outlet to the opening.

6. The electronic device of claim 1, wherein the guide vane is configured to increase airflow and reduce noise generated by the air passing through the fan assembly.

7. The electronic device of claim 1, further comprising a heat-generating component located in the internal volume, where the air comprises heated air by the heat-generating component.

8. An electronic device, comprising:
   an enclosure that defines an internal volume, the enclosure comprising an opening; and
   a fan assembly positioned in the internal volume, the fan assembly comprising:
     a first housing part that defines a first fan inlet,
     a second housing part defining a second fan inlet, the second housing part comprising a sidewall coupled with the first housing part, the sidewall having a first height, wherein the first housing part and the second housing part define a fan outlet that is separate from the first fan inlet and the second fan inlet,
     an impeller positioned between the first housing part and the second housing part, the impeller configured to draw air into the first fan inlet and the second fan inlet, and
     a guide vane that extends from the second housing part and lacks contact with the first housing part, the guide vane comprising a second height greater than the first height.

9. The electronic device of claim 8, wherein the guide vane comprises:
   a rectangular portion; and
   a tapered region extending from the rectangular portion.

10. The electronic device of claim 9, wherein the rectangular portion is coupled to the second housing part.

11. The electronic device of claim 8, wherein the first fan inlet and the second fan inlet each define a circular fan inlet.

12. The electronic device of claim 11, wherein the fan outlet comprises a rectangular fan outlet.

13. The electronic device of claim 8, further comprising:
   a motor coupled to the impeller;
   a platform that carries the motor; and
   struts integrated with the second housing part and connected to the platform, wherein the motor and the struts impede the air that enters the second fan inlet.

14. The electronic device of claim 8,
   a display assembly secured with the enclosure;
   a transparent protective cover that overlays the display assembly; and
   a stand, wherein the enclosure is rotationally coupled with the stand.

15. An electronic device, comprising:
   an enclosure that defines an internal volume, the enclosure comprising an opening;
   a display coupled with the enclosure;
   a stand rotationally coupled to the enclosure;
   a heat-generating component positioned in the internal volume; and
   a fan assembly positioned in the internal volume, the fan assembly configured to draw air that is heated by the heat-generating component out of the enclosure via the opening, the fan assembly comprising:
     a first housing part, a second housing part comprising a sidewall coupled with the first housing part, the sidewall comprising a first height, and a guide vane that directs the air received by the fan assembly prior exiting the opening, the guide vane covered by, and in contact with, the first housing part and the second housing part, wherein the guide vane comprises a second height greater than the first height.

16. The electronic device of claim 15, wherein the fan assembly comprises:

a fan housing that defines one or more fan inlets and a fan outlet; and an impeller that drives air into the one or more fan inlets, wherein at least some of the air received by the impeller is directed by the guide vane prior to passing through the fan outlet.

17. The electronic device of claim 16, wherein:

the first housing part defines a first fan inlet of the one or more fan inlets; and the second housing part defines a second fan inlet of the one or more fan inlets, wherein the first housing part and the second housing part define the fan outlet.

18. The electronic device of claim 17, wherein the guide vane extends from the second housing part.

19. The electronic device of claim 17, wherein the guide vane is integrally formed with the second housing part.

* * * * *